United States Patent
Suga et al.

(10) Patent No.: US 6,625,554 B2
(45) Date of Patent: Sep. 23, 2003

(54) METHOD AND APPARATUS FOR DETERMINING A MAGNETIC FIELD

(75) Inventors: Takashi Suga, Yokohama (JP); Kouichi Uesaka, Kawasaki (JP); Satoshi Nakamura, Yokohama (JP); Yoshihiko Hayashi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 161 days.

(21) Appl. No.: 09/888,112

(22) Filed: Jun. 22, 2001

(65) Prior Publication Data

US 2003/0001596 A1 Jan. 2, 2003

(51) Int. Cl.$^7$ .......................... G01R 19/00; G06F 19/00
(52) U.S. Cl. ................................. 702/64; 324/750
(58) Field of Search ................ 702/64, 65; 324/754, 324/95, 765, 750, 752, 117

(56) References Cited

U.S. PATENT DOCUMENTS

| | | | | | |
|---|---|---|---|---|---|
| 4,342,958 | A | * | 8/1982 | Russell | 324/754 |
| 5,631,572 | A | * | 5/1997 | Sheen et al. | 324/754 |
| 5,977,783 | A | * | 11/1999 | Takayama et al. | 324/754 |
| 6,084,396 | A | * | 7/2000 | Rao | 324/158.1 |
| 6,087,842 | A | * | 7/2000 | Parker et al. | 324/763 |
| 6,097,203 | A | * | 8/2000 | Parker et al. | 324/763 |
| 6,150,809 | A | * | 11/2000 | Tiernan et al. | 324/238 |
| 6,177,802 | B1 | * | 1/2001 | Shabde et al. | 324/537 |
| 6,208,126 | B1 | * | 3/2001 | Gonthier | 323/324 |
| 6,252,412 | B1 | * | 6/2001 | Talbot et al. | 324/750 |
| 6,285,957 | B1 | * | 9/2001 | Tanaka et al. | 702/57 |
| 6,331,782 | B1 | * | 12/2001 | White et al. | 324/763 |
| 6,456,070 | B1 | * | 9/2002 | Kazama et al. | 324/260 |
| 6,496,013 | B1 | * | 12/2002 | Buks et al. | 324/538 |

FOREIGN PATENT DOCUMENTS

| JP | P2000-206163 A | 7/2000 |
|---|---|---|
| JP | 2000-206163 | 7/2000 |

OTHER PUBLICATIONS

Johnson et al., "Ferromagnet—Semiconductor Hybrid Hall Effect Device", Device Research Conference Digest, 1997. 55th, 158–159.*

* cited by examiner

Primary Examiner—Marc S. Hoff
Assistant Examiner—Mary Catherine Baran
(74) Attorney, Agent, or Firm—Townsend and Townsend and Crew LLP

(57) ABSTRACT

The present invention provides a magnetic field measuring method and system for determining the magnetic field of an integrated circuit (IC) inside the IC package, including the pre-packaged IC. In one embodiment, induced voltages due only to the magnetic field are determined at measurement heights on the order of the line spacings in an integrated circuit. A magnetic probe is used; the probe has a loop of wire parallel to the current, for measuring the induced voltage of the horizontal component of the magnetic field. The induced voltage due to the electric field is removed by using a calculation including the difference of two measurements. The magnetic field distribution for the integrated circuit may be determined by using the above procedure on a grid like pattern above the IC.

19 Claims, 11 Drawing Sheets

METHOD AND APPARATUS FOR DETERMINING A MAGNETIC FIELD

BACKGROUND OF THE INVENTION

The present invention generally relates to the field of Electro-magnetic wave measurement and particularly to techniques for measuring a magnetic field of an integrated circuit (IC) inside the IC package, including the IC without the IC packaging. And more particularly to IC's with densities about or greater than the current Large Scale Integrated (LSI) circuits.

FIG. 1 shows an example of a magnetic field distribution 114 of a package 110 having an integrated circuit (IC), for example, a LSI or an Ultra Large Scale integrated (ULSI) circuit. In FIG. 1 the package 110 is shown with cut-away section 112 illustrating the IC inside the package. Conventionally, the magnetic field distribution 114 outside of the package 110 is determined using a magnetic probe or sensor 116 from which induced voltage measurements are taken. In other words, typically measurements are taken of the IC outside of the IC packaging. The induced voltage is caused by currents in the integrated circuit and is used to determine the magnetic field at the position of the magnetic probe or sensor 116.

One reason for determining the magnetic field distribution of the package 110 is to solve any Electro-Magnetic Interference (EMI) problems that may be caused by the currents in the IC. In order to reduce the EMI, the source of the interference needs to be pinpointed. An example is given in Japanese Patent Application "Apparatus And The Method For Detecting Electromagnetic Wave Source, And Method For Analyzing The Same," by Uesaka Koichi, JP11-117028, filed Apr. 23, 1999. However, as circuit sizes shrink, for example, today LSI's are produced by a 0.1 $\mu$m process, it is necessary to perform measurements of the magnetic field very close to the circuit wirings, for example, cut-away section 112 inside the package 110, in order to pinpoint the source of potential interference.

In addition, determining the magnetic field distribution inside the IC package 110, may lead to production of low noise integrated circuits. Locations on the IC with a relatively high magnetic field indicate relatively high noise points. Of the several conventional techniques to reduce the magnetic field at these points, an example is changing the line pattern to reduce the noise.

Japanese Application No. JP11-006485, "Method And Apparatus For Measuring Electromagnetic Field Strength And Method And Apparatus For Measuring Current And Voltage Distribution," by Satoshi Kazama, et. al., filed Jan. 13, 1999, discloses the use of a loop antenna as a probe to determine the magnetic field over, for example, a circuit board. Other examples given are a lead wire of several centimeters, a microstrip line (i.e., a planar transmission line), a unit of a component on a board, and a circuit substrate of an electrical equipment. The loop probe is used for measurements in the neighborhood of 2 mm from the submitted equipment. Thus the disclosed use was for improving magnetic field determinations above equipment, for example, a unit on a board, not for inside an IC package.

In the above Japanese Application No. JP11-006485, the electromagnetic field of the circuit board generates an electric field coupling current and a magnetic field coupling current in a loop antenna above the circuit board. In the probe the electric field coupling current and the magnetic field coupling current are outputted toward the same direction at a certain part of the loop probe, but toward opposite directions at another part of the loop probe. A first composite current, i.e., electric field coupling current and the magnetic field, measured at one end of the loop probe by a current measuring device, gives the electric field coupling current plus the magnetic field coupling current. A second composite current measured at the same end of the loop probe by the same current measuring device, after rotating the loop probe 180 degrees, gives the electric field coupling current minus the magnetic field coupling current. Therefore, the electric field coupling current and the magnetic field coupling current can be calculated using these two composite currents. And the electric field component and the magnetic field component of the electromagnetic field at the loop probe can be derived from these composite currents.

However, using Japanese Application No. JP11-006485 in determining the magnetic field distribution of an IC package has only a secondary improvement in the measurement of the magnetic near-field distribution. Thus the conventional technique provides sufficiently accurate magnetic field measurements, and there is no significant advantage in using the techniques disclosed in Japanese Application No. JP11-006485 over the conventional techniques in the case of packaged IC magnetic field measurements. In addition, Japanese Application No. JP11-006485 rotates the probe to take the composite current measurements, when using one current measuring device. This rotation is time-consuming and a more efficient method of taking measurements is needed.

In order to pinpoint the source of potential interference in IC's, measurements of the magnetic field on the order of tens of micrometers ($\mu$m), for example, 30 $\mu$m, above the IC wirings, i.e., inside the IC package, need to be made. Cut-away section 112 shows inside the IC package 110. However, in measuring the magnetic field inside the IC package, a significant coupling capacitance due to the electric field develops and the accuracy of the magnetic field probe to measure only the magnetic field deteriorates. Therefore there is need for techniques which minimize the effect of the electric field on the magnetic field probe inside an IC package to improve the accuracy of measurements of the magnetic field distribution.

SUMMARY OF THE INVENTION

The present invention provides a magnetic field measuring method and device for accurately determining the magnetic field distribution of an integrated circuit inside the IC package, including the IC without the IC packaging. In one embodiment, induced voltages due only to the magnetic field are determined at measurement heights on the order of 30 $\mu$m, i.e., inside the IC package (or for example, the pre-packaged IC) by using a magnetic probe, having a loop of wire parallel to the current, for measuring the induced voltage of the horizontal component of the magnetic field. The induced voltage due to the electric field is removed by using a calculation including the difference of two measurements. The first measurement is taken with a voltage meter coupled to the first terminal of the loop of wire and ground coupled to the second terminal. And the second measurement has the couplings reversed due to a cross-bar switch, i.e., a voltage meter coupled to the second terminal of the loop of wire and ground coupled to the first terminal. Thus only the induced voltage due to the magnetic field remains, after the calculation. The magnetic field distribution for the integrated circuit may be determined by using the above procedure to scan a grid like pattern above the IC.

In another embodiment a method for determining a component of a magnetic field of an IC at a height above the IC on the same order of magnitude as a distance between the IC's lines is provided. The method includes measuring a first induced voltage, having a first electric field induced voltage, due to a current carrying line's electromagnetic field. A second induced voltage due to the current carrying line's electromagnetic field is measured, such that the second induced voltage includes a second electric field voltage that is substantially equal to the first electric field induced voltage; The component of the magnetic field is determined based on a difference between the first induced voltage and the second induced voltage.

An alternate embodiment of the present invention provides a method for determining a magnetic field for a current carrying line of a plurality of current carrying lines inside an IC package, for example a LSI or VLSI circuit package. The method includes, measuring a first induced voltage due to a current carrying line's electromagnetic field, where the first induced voltage has a first measured voltage proportional to a magnetic field produced by the current carrying line. Next, a second induced voltage due to said current carrying line's electromagnetic field is measured in a manner so that the second induced voltage has a second voltage that is substantially equal to a negative of the magnitude of the first measured voltage; and a component or part of the magnetic field is determined based on a difference between the first induced voltage and the second induced voltage.

Another embodiment provides a magnetic field probe for determining a magnetic field distribution of a LSI circuit, including: a measuring probe for measuring an induced voltage produced by an electromagnetic field of the LSI circuit at a height above the integrated circuit on a same order of magnitude as a distance between the LSI's circuit current carrying lines, the measuring probe including a first termination point coupled with a second termination point by an electronic circuit; a voltage measuring device for measuring the induced voltage; and a switch in which a first end is coupled to the measuring probe via the first and second termination points and a second end is coupled to the voltage measuring device and to ground, where when the switch is in a first position, the first termination point is coupled to the voltage measuring device and the second termination point is coupled to ground, and when the switch is in a second position, the first termination point is coupled to ground and the second termination point is coupled to the voltage measuring device.

These and other embodiments of the present invention are described in more detail in conjunction with the text below and attached figures.

DESCRIPTION OF THE SPECIFIC EMBODIMENTS

The following is a description of the embodiments of the present invention.

Figure 2:
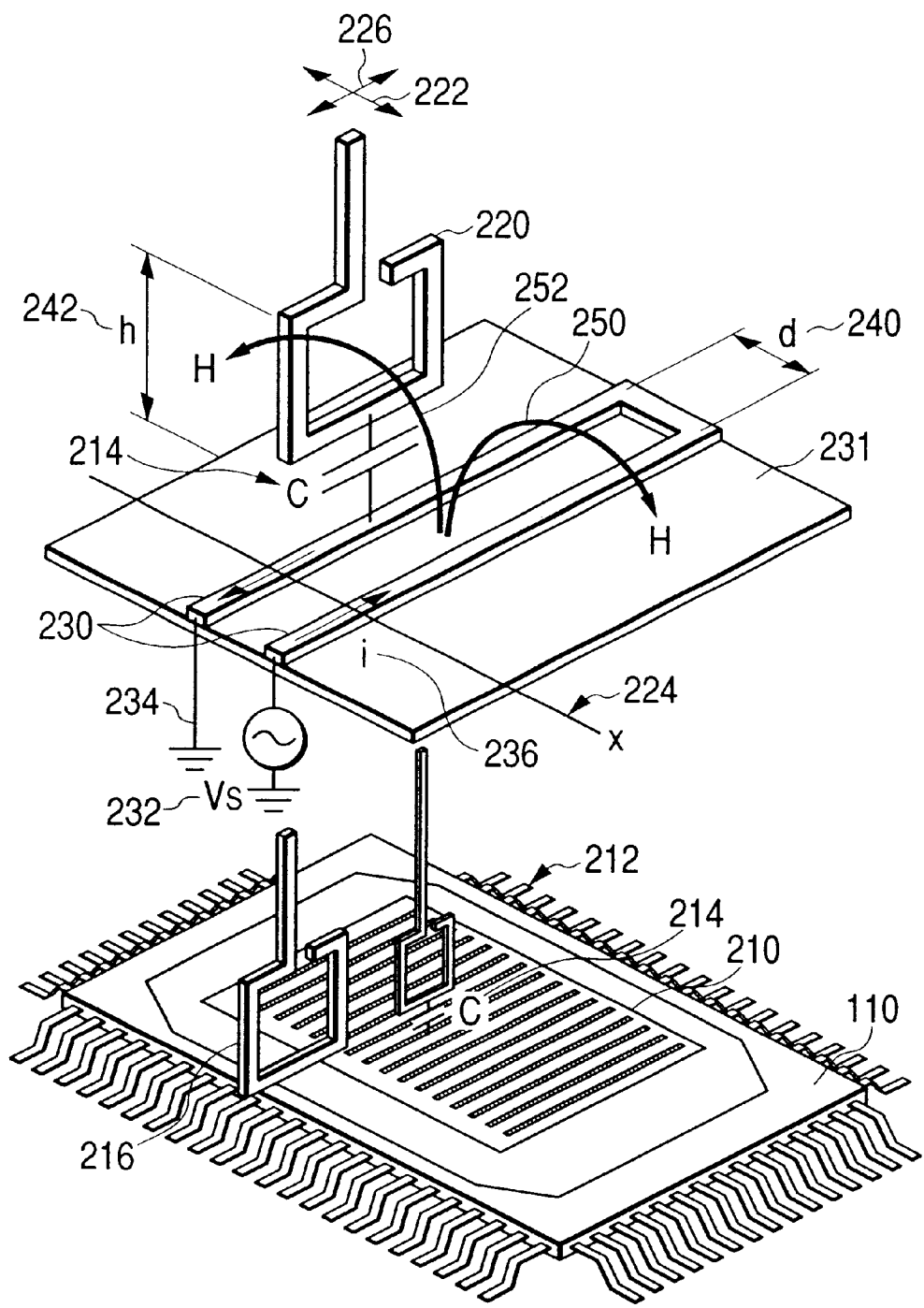
FIG. 2 shows a magnetic probe of an embodiment of the present invention taking measurements from a circuit.

FIG. 2 shows a magnetic field probe of an embodiment of the present invention taking measurements from a circuit. Conventionally a magnetic field probe, illustrated by magnetic field probe 216, is used over the IC package 110, and has a size on the order of 1000 $\mu$m. When the measurement height is on the order of 30 $\mu$m inside the IC 210, the magnetic field probe 212 has a size on the order of 30 $\mu$m. In this case, a coupling or parasitic capacitance, shown by coupling capacitor C 213, occurs between the circuit 210 and the probe 212. For illustration purposes, a "U" shaped active current carrying line 230 is shown on the horizontal plane 231 (parallel to circuit 210), where the circuit line 230 is an example of a signal or power line of integrated circuit 210 in package 110. The line 230 has an AC or a noise voltage source $V_S$ 232 which drives current "i" 236 through line 230 to ground 234. The two parallel lines of line 230 are spaced "d" $\mu$m apart. A magnetic field probe 220, having, in effect, an induction loop, is placed parallel to line 230 and has a height "h" $\mu$m 242 above horizontal plane 231. The magnetic field probe 220 may be moved in the x-direction 222 (i.e., "x" 224), that is perpendicular to line 234 or in the y-direction 226 parallel to line 230. The current line 234 has a magnetic field shown by H 250 and H 252. The horizontal component of magnetic field H 252 induces a voltage in magnetic field probe 220. The current 236 also causes an electric field represented by a coupling capacitor C 214, which also induces a voltage in magnetic field probe 220. To determine an accurate or "true" magnetic field measurement at the position of the magnetic field probe 220, the voltage due to coupling capacitor 214 must be removed from the calculation of the magnetic field.

Figure 3:
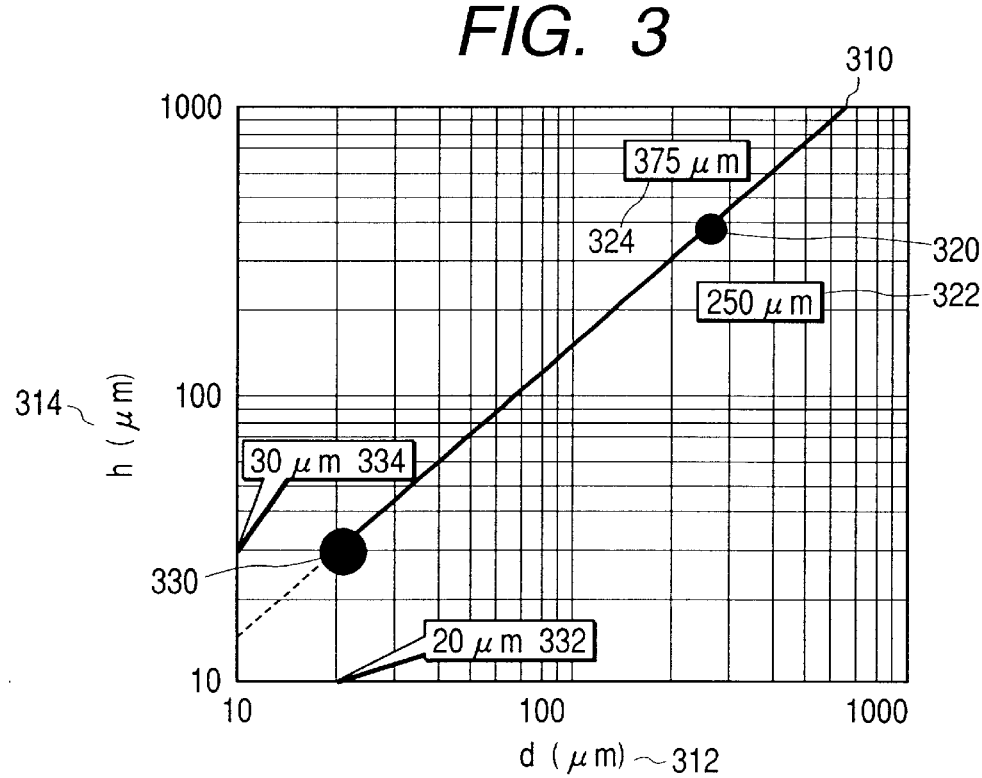
FIG. 3 shows a curve for the required measurement height h for a given resolution distance d.

FIG. 3 shows a curve 310 for the required measurement height h 314 for a given resolution distance d 312. The given resolution distance d 312 represents the distance between, for example, IC power lines. And the measurement height h 314 is the bottom of the probe 220 height above the power line. For a conventional measurement using a probe 216 over a power pin of a circuit package 110, d=250 μm 322 and h=375 μm 324. For testing of one embodiment of magnetic field probe 220, a power line for line 230 was used with d=20 μm 332 and h=30 μm 334.

Figure 4:
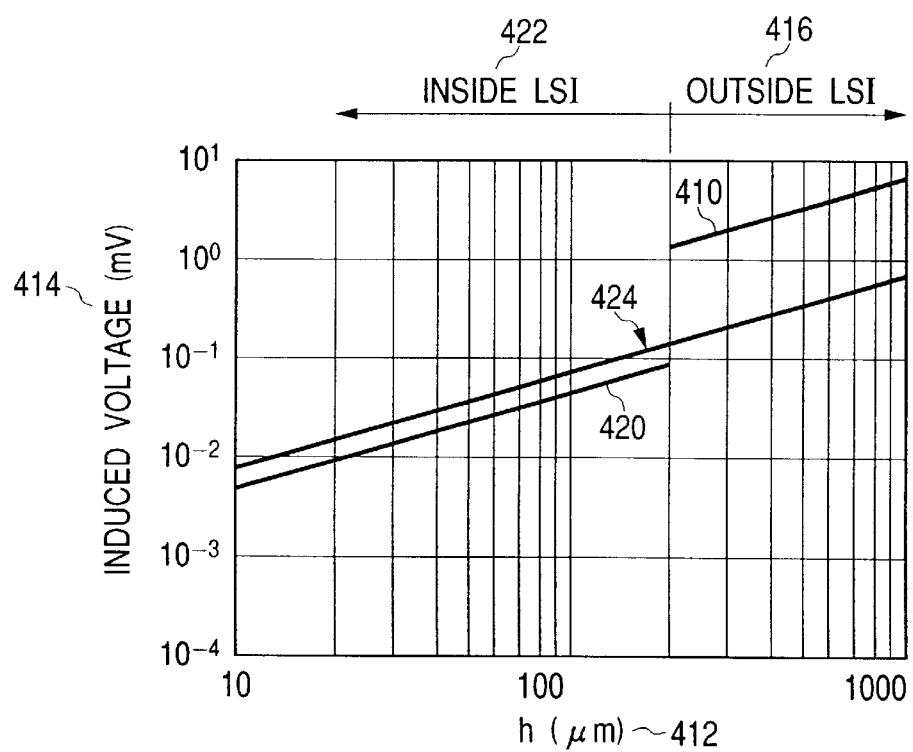
FIG. 4 shows the induced voltage measured by the magnetic field probe in mV versus the measurement height h due to the magnetic field and the capacitor coupling for inside the LSI and for outside the LSI of an embodiment of the present invention.

FIG. 4 shows the induced voltage 414 measured by the magnetic field probe 220 in mV versus the measurement height h 412 due to the magnetic field and the capacitor coupling for inside the LSI circuit package 422 and for outside the LSI circuit package 416 of an embodiment of the present invention. Line 410 shows the induced voltage 414 generated by the magnetic field outside the LSI circuit package 416 and line 420 shows the induced voltage 414 generated inside the LSI circuit package 422. Line 424 shows the induced voltage 414 generated in the magnetic field probe by the capacitive coupling for both outside the LSI circuit package 416 and inside the LSI circuit package 422. FIG. 4 shows that the induced voltage (line 424) due to the capacitive coupling is about 20 times less than the induced voltage (line 410) due to the magnetic field for outside the LSI circuit package 416. However, inside the LSI circuit package 422, the induced voltage (line 424) due to the capacitive coupling is larger than the induced voltage (line 420) generated by the magnetic field. Thus the capacitive coupling only presents a serious problem in the measurement of the magnetic field inside the LSI circuit package 422.

FIG. 4 illustrates that outside the LSI circuit package 416, capacitive coupling is a secondary effect, and in conventional magnetic field measurement systems is ignored. Thus using the system as disclosed by JP Application No. 2000-206163 for measuring the magnetic field distribution of one or more LSI devices on a circuit board has no significant advantages over the conventional systems.

In one embodiment of the present invention the magnetic field measurements are taken inside the IC with the magnetic probe's measuring height above the IC on the same order of magnitude as a distance between the IC's current carrying lines inside the IC package. In addition the magnetic probe may optionally have about the same dimensions (for example, length and width) as the measurement height above the IC. A simplified example, with d=20 μm, is that h=30 μm and a square magnetic probe has dimensions of 30 μm by 30 μm.

Figure 5:
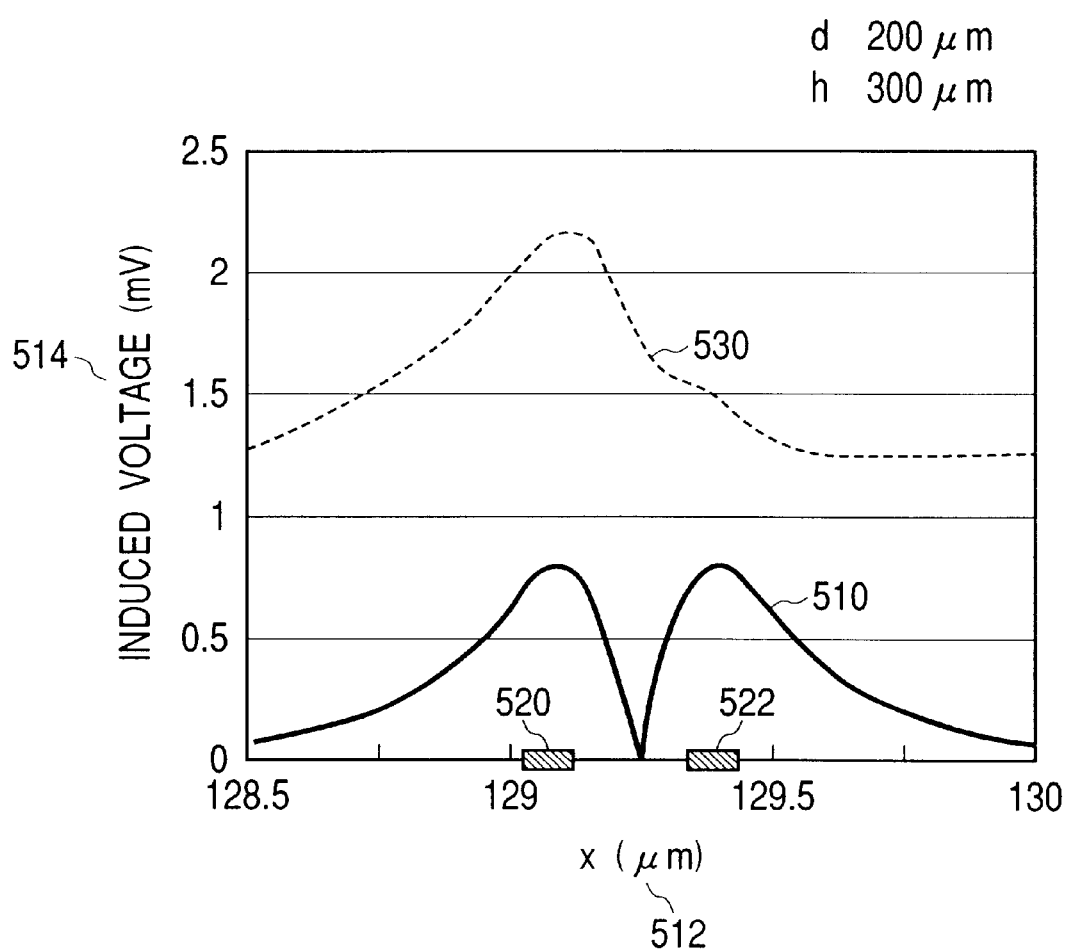
FIG. 5 shows the measured induced voltage versus distance for one scaled example of FIG. 2.

FIG. 5 shows the measured induced voltage versus distance for one scaled example of FIG. 2. A cross-section of line 230 in FIG. 2 is shown by line cross-sections 520 and 522 in FIG. 5. The x-axis in FIG. 5 is the distance measurement along "x" 224 in FIG. 2. The induce voltage 514 measured by the magnetic field probe is given in milli-volts on the vertical axis. FIG. 5 is a 10 times scale model of the probe 220 and line 230 on horizontal plane 231 in FIG. 2. Hence d=(10×20)=200 μm and h=(10×30)=300 μm. The graph 510 shows the theoretical curve for the induced voltage due only to the magnetic field. There exists a null between the two cross-sections 520 and 522, because the current goes into the page at 522 and comes out of the page at 520. At the center plane between the cross-sections 520 and 522, the horizontal component of the magnetic field due to each cross-section cancels the other. However, the measured value of the induced voltage by the magnetic field probe is given by graph 530. The graph 530 illustrates an induced voltage due both to a magnetic field, as well as, the electric field.

FIGS. 6 to 9 show the reasons why the magnetic field probe 220 of an embodiment of the present invention works. While one embodiment of a magnetic field probe is given, any magnetic field measuring device which uses the same concepts to remove the effect of the electric field from the induced voltage measurement is also within the scope of the present invention.

Figure 6:
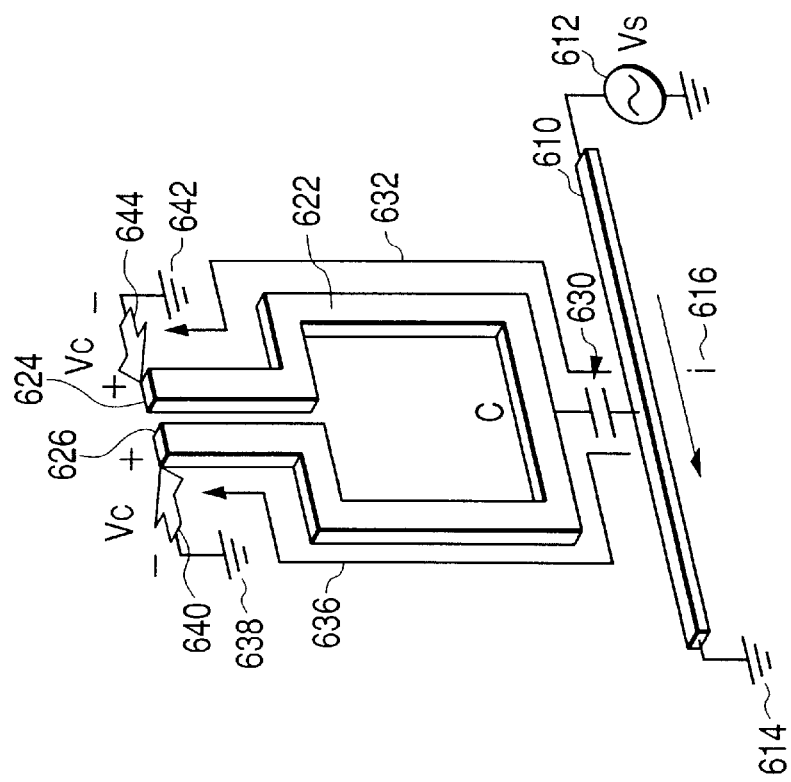
FIG. 6 shows a magnetic field probe measuring an induced voltage $V_H$ due to only the magnetic field of one embodiment of the present invention.

FIG. 6 shows a magnetic field probe 622 measuring an induced voltage $V_H$ 632 due to only the magnetic field of one embodiment of the present invention. The current i 616 comes from a AC (or a noise) voltage source $V_S$ 612 and the current i 616 has magnetic field H 620 which induces current 630 in probe 622. Note that voltage source $V_S$ 612 is the varying voltage and the bias voltage, if any, is not shown. The induced current 630 flows from the positive terminals 624 in magnetic field probe 622 to the negative terminal 626. The induced voltage due to magnetic field H 620 is given by the $V_H$ 632. The voltage $V_H$ may be an averaged or root mean squared (rms) voltage.

Figure 7:
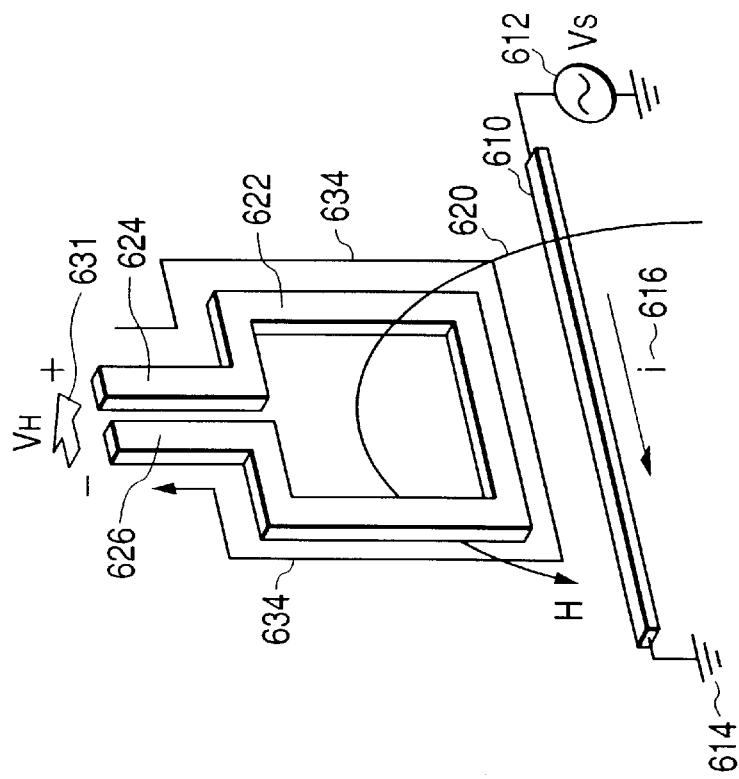
FIG. 7 shows the induced voltage $V_C$ in magnetic field probe due to only the electric field of current of an embodiment of the present invention.

FIG. 7 shows the induced voltage $V_C$ in magnetic field probe 622 due to only the electric field of current i 616 of an embodiment of the present invention. The electric field is modeled by coupling capacitor C 630, and shows two induced currents 632 and 636. The induced current 632 goes from a voltage source $V_S$ 612 through the coupling capacitor C 630 to terminal 624 of the magnetic field probe 622 and gives an induced voltage of $V_C$ 644. The second induced current 636 goes from voltage source $V_S$ 612 through coupling capacitor C 630 to terminal 626 of the magnetic field probe 622 and gives induced voltage $V_C$ 640. The induced voltage $V_C$ 644 ( and similarly 640) may be measured by connecting a voltage meter from terminal 624 (similarly 626) to ground 642 (similarly 638). The voltage $V_C$ 640 is equal to minus $V_C$ 644. The voltage $V_C$ may be an averaged or root mean squared (rms) voltage.

Figure 8:
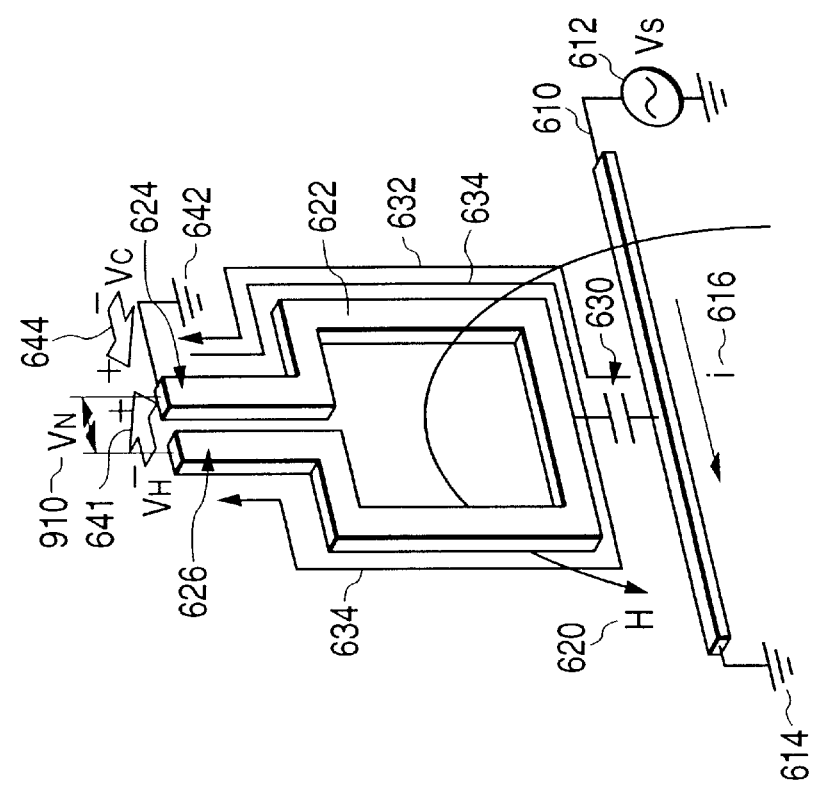
FIG. 8 shows the induced voltage $V_P$ measured with the magnetic field probe of an embodiment of the present invention.

FIG. 8 shows the induced voltage $V_P$ 810 measured with the magnetic field probe 622 of an embodiment of the present invention. $V_P$ 810 with the positive terminal at terminal 624 and the terminal 626 grounded, is equal to the induced voltage $V_H$ 632, due to the magnetic field H 620, added to the induced voltage $V_C$ 640, due to the coupling capacitor C 630 and induced current 636. There is no induced voltage $V_C$ 644 as there is no induced current 632. Thus:

$$V_P = V_H + V_C \qquad \text{(Equation 1)}$$

Figure 9:
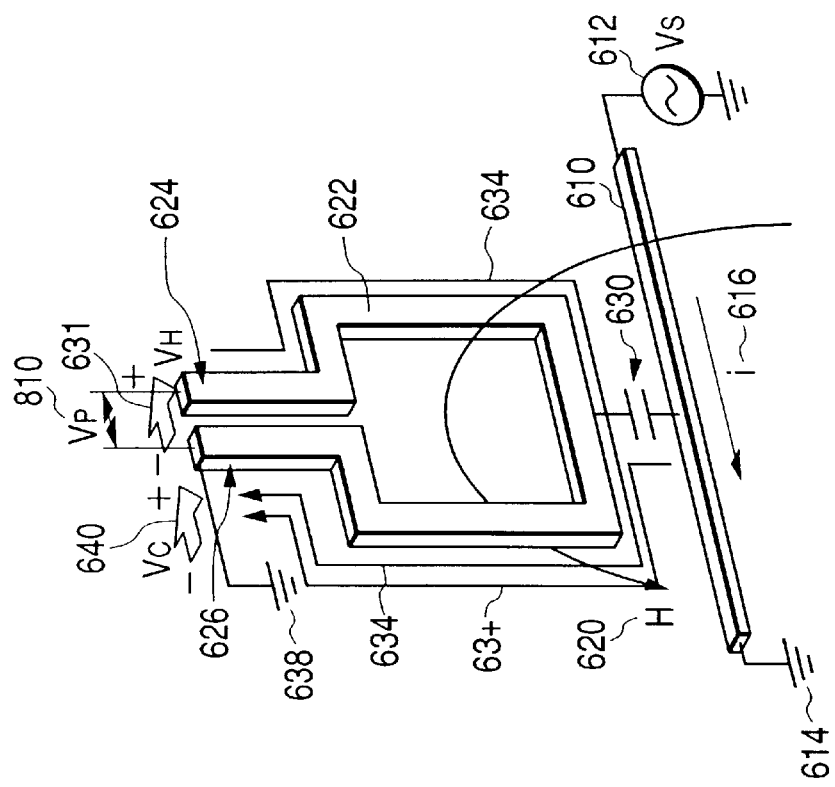
FIG. 9 shows the induced voltage $V_N$ measured with the magnetic field probe of an embodiment of the present invention.

FIG. 9 shows the induced voltage $V_N$ 910 measured with the magnetic field probe 622 of an embodiment of the present invention. $V_N$ 910 with the positive terminal at terminal 626 and the terminal 624 grounded, is equal to the induced voltage $V_H$ 641, due to the magnetic field H 620. Starting at ground 642 $V_H$ 640 is subtracted from the induced voltage $V_C$ 644, due to the coupling capacitor C 630 and induced current 632. There is no induced voltage $V_C$ 640 as there is no induced current 636. Thus:

$$V_N = (-V_H) + V_C \qquad \text{(Equation 2)}$$

If Equation 2 is subtracted from Equation 1, then:

$$\begin{aligned} V_P &= V_H + V_C \\ \text{minus}\quad V_N &= (-V_H) + V_C \\ \hline (V_P - V_N) &= 2V_H \end{aligned} \qquad \text{(Equation 3)}$$

Thus:

$$V_H = (V_P - V_N)/2 \qquad \text{(Equation 4)}$$

Figure 10:
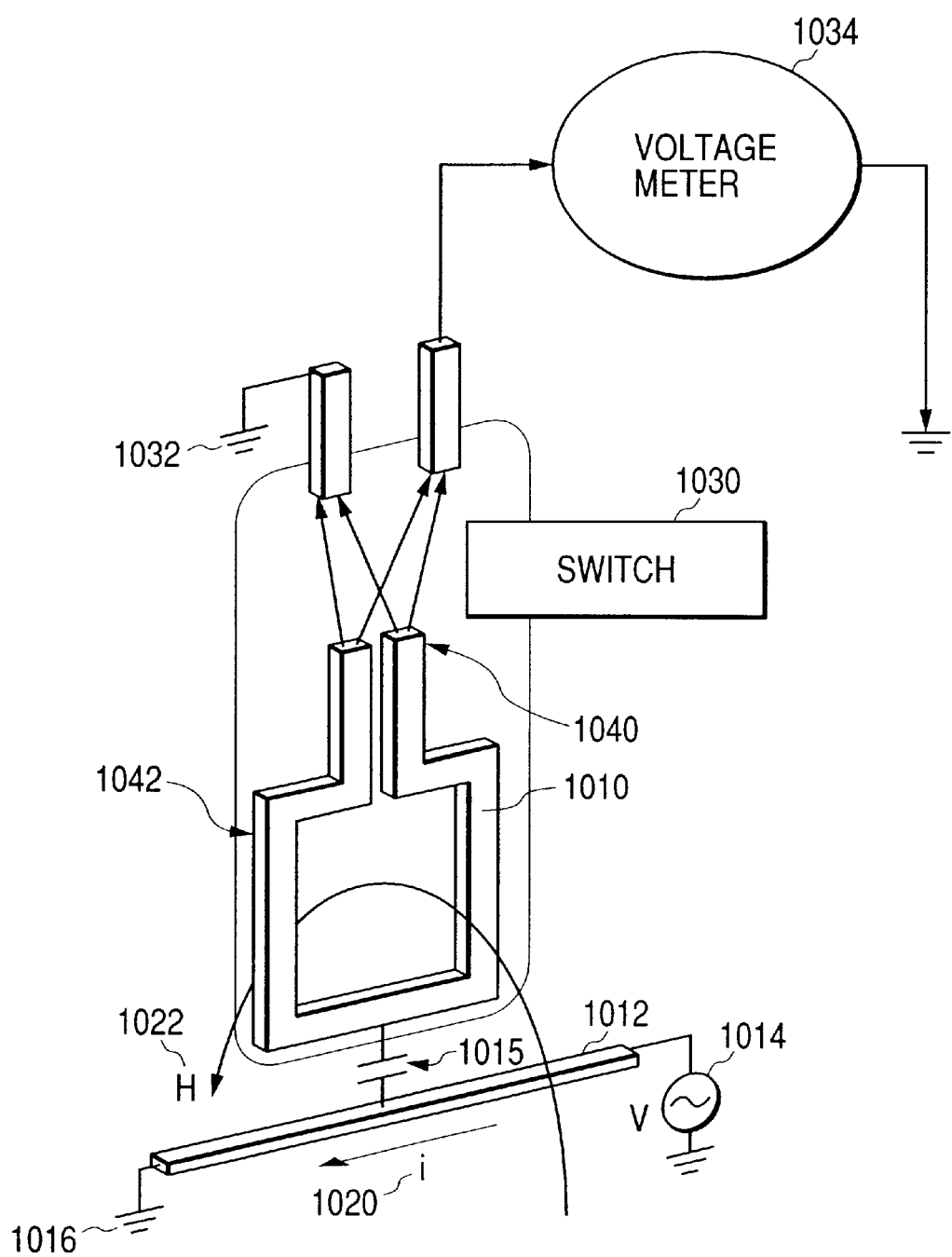
FIG. 10 shows an example of a magnetic field probe of one embodiment of the present invention.

FIG. 10 shows an example of a magnetic field probe system of one embodiment of the present invention. The magnetic field probe system includes a coil or loop 1010, a switch 1030, a connection to ground 1032, and a connection to a voltage meter 1034. The switch 1030 may be, for example, a crossbar switch, connecting voltage meter 1034 to terminal 1040 and ground 1032 to terminal 1042 (switch position A) or alternately connecting voltage meter 1034 to terminal 1042 and ground 1032 to terminal 1040 (switch position B). The coil 1010 is first used, for example, with the crossbar switch 1030 in position A and the induced voltage measure via voltage meter 1034, giving for example, $V_P$, which is stored in a memory of a computer (not shown). And then with the coil 1010 in the same position the switch 1030 is set to position B (also computer controlled) and the induced voltage again measured to give, for example, $V_N$, which is also stored in the computer memory. A simple program executed by a processor of the computer can read both, $V_P$ and , $V_N$ and calculate , $V_H$ using equation 4 above.

Figure 11:
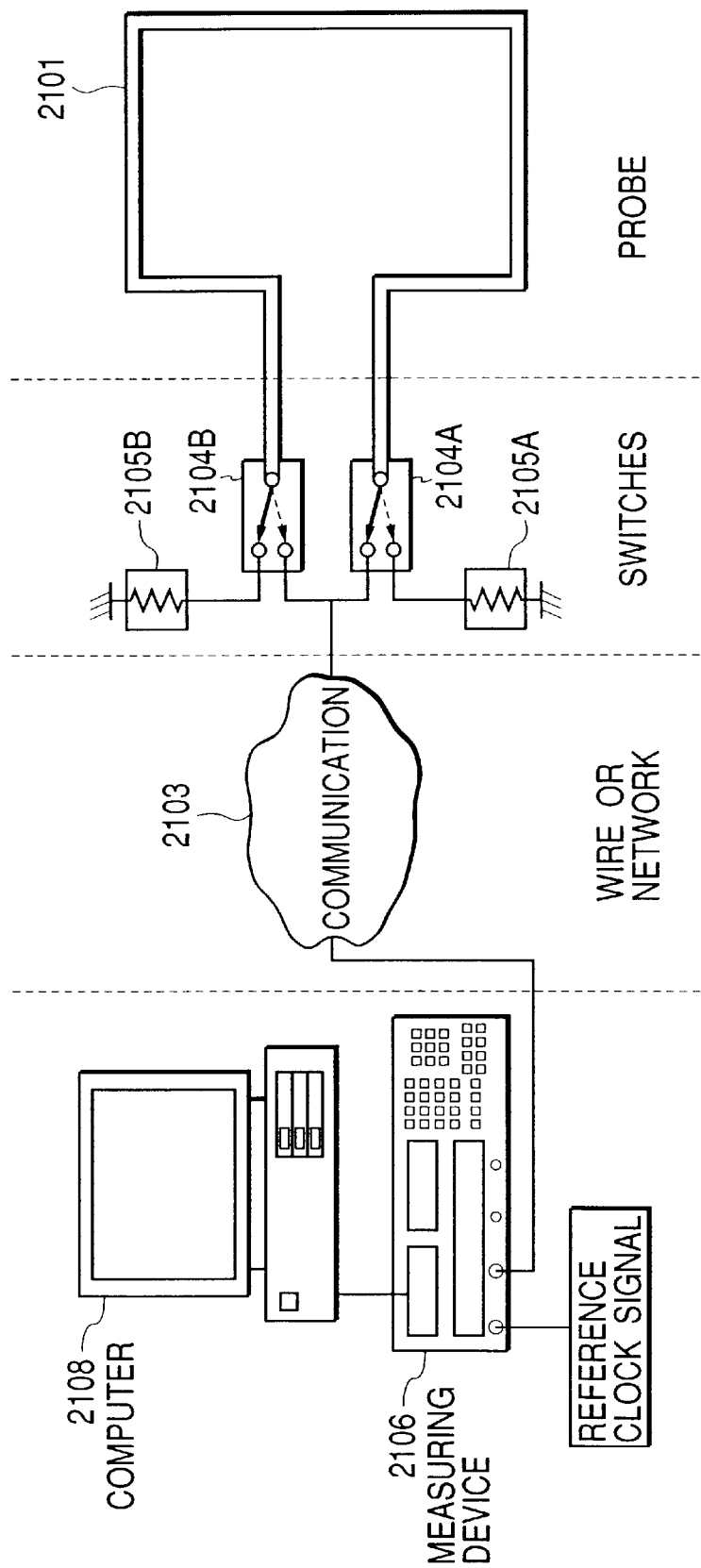
FIG. 11 shows another embodiment of the magnetic probe system architecture.

FIG. 11 shows another embodiment of the magnetic probe system architecture. A probe 2101, for example, an induction coil or loop, is connected at each end point to switches 2104A and 2104B. The switches 2104A and 2104B have one output connected to terminal resistors 2105A and 2105B to ground and the other outputs connected to each other and to a wire or network 2103. The switches 2104A and 2104B are controlled by the computer 2108 (control lines not shown), which either has switch 2104A connected to its terminal resistor 2105A and switch 2104B connected to the network or wire 2103 or vice versa. The switches 2104A and 2104B are connected via a network or wire 2103 to a measuring device 2106, for example, a voltage meter or a digital scope. The measuring device 2106 measures the induced voltage in the probe 2101. The measuring device 2106 sends its measurements to a computer 2108, for example, a PC or workstation, where the magnetic field is calculated. The system in FIG. 11 functions similarly to the system in FIG. 10.

Figure 1:
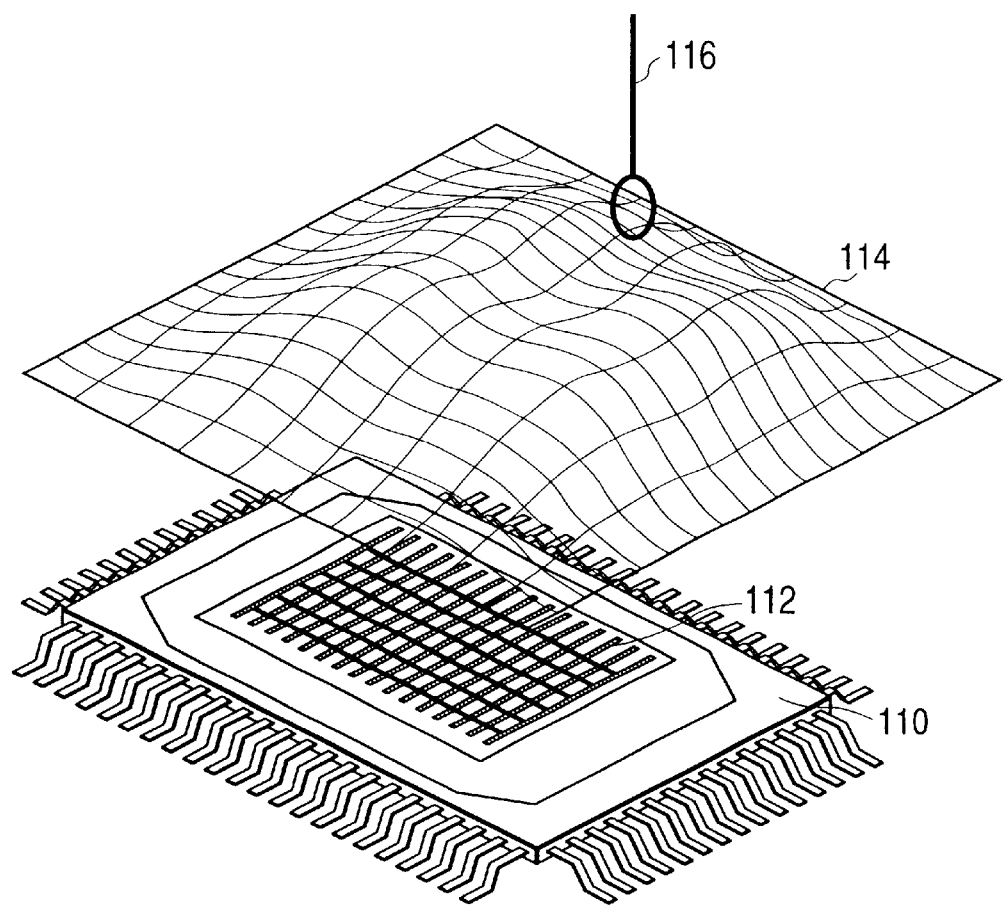
FIG. 1 shows a magnetic field distribution of a package having an integrated circuit (IC), for example, a Large Scale Integrated (LSI) circuit.
Figure 12:
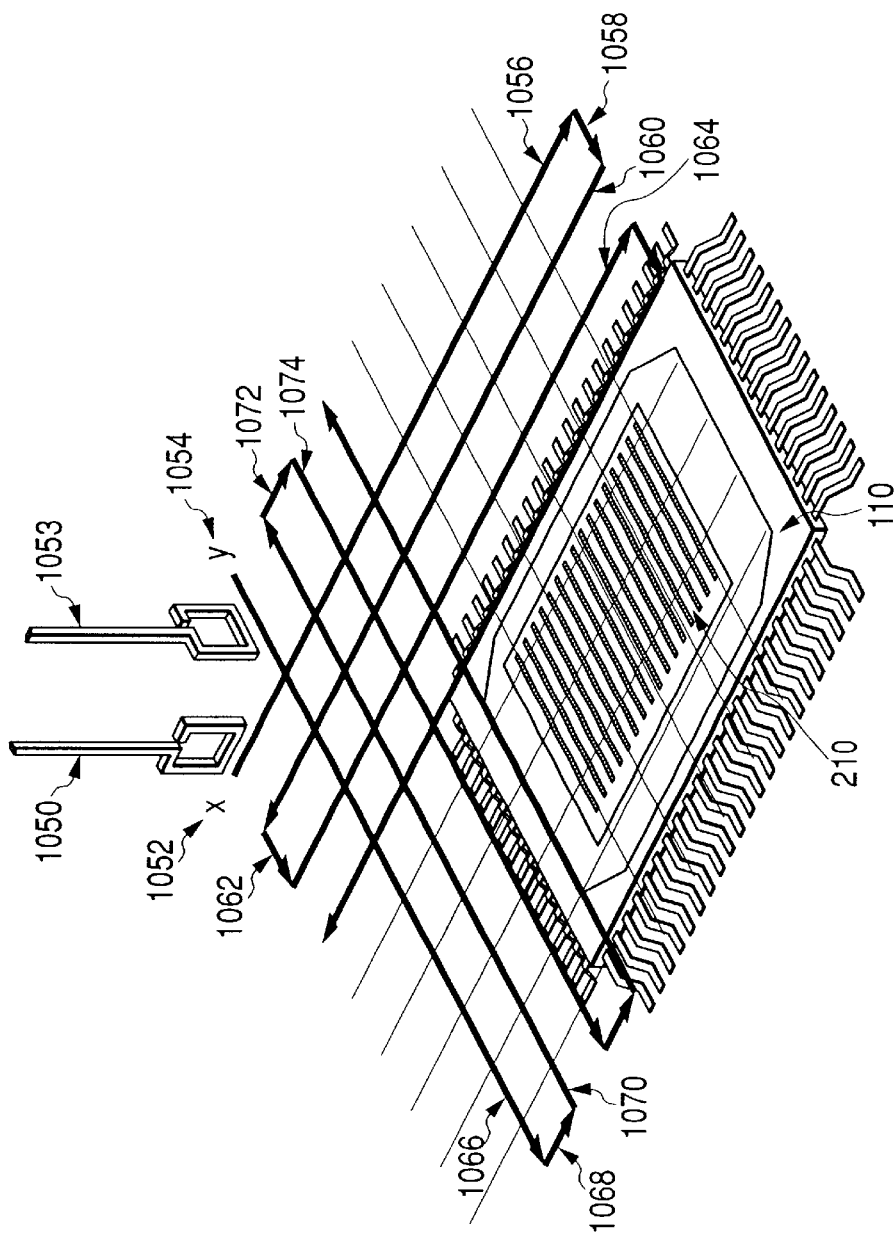
FIG. 12 shows an x-y grid for guiding the movement of the magnetic filed probe in order to plot the magnetic field distribution of the IC of an embodiment of the present invention.

FIG. 12 shows an x-y grid for guiding the movement of the magnetic filed probe 1050 in order to plot the magnetic field distribution of the IC 210 (for example, inside the LSI 422 of FIG. 4) of an embodiment of the present invention. The objective is to obtain a magnetic field distribution analogous to 114 in FIG. 1, but for a distance h on the order of 30 μm above the IC 210 rather than 1000 μm above the package 110 as shown in FIG. 1. FIG. 12 shows a grid of x 1052 versus y 1054 in which a magnetic field probe 1050 (or 1053 which is probe 1050 rotated by 90 degrees) like that shown in FIG. 10 is moved in order to measure the x-component and y-component of the magnetic field H. These two components represent the mathematical basis making up the vector component of the magnetic field H in a horizontal plane such as 231 in FIG. 2. In other embodiments any other two independent vectors may be uses as the basis, and the grid modified appropriately. First probe 1053 which is shown parallel to line 1066 is moved along the y component path starting with 1066 to 1068 to 1070 to 1072 to 1074 and so on, where the probe 1053 is parallel to grid lines 1066, 1070, and 1074. On grid lines 1068 and 1072 the probe 1053 takes no measurements. Two measurements of induced voltages, i.e., $V_P$ and $V_N$, are taken at each grid point or intersection of the x 1052 and y 1054 lines. And for each grid point a $V_H$ is calculated for the x-component vector of the magnetic field $H_x$, where the x-component vector of H is proportional to $V_H$. Then probe 1053 is rotated 90 degrees, e.g., probe 1050, to measure the y-component, $H_y$ and in parallel follows the path 1056, 1060 (via 1058), and 1064 (via 1062) and so on. Again two induced voltage measurements, $V_P$ and $V_N$, are taken at each grid point and a $V_H$ is calculated for the y-component vector of the magnetic field H, where the y-component vector of H is proportional to $V_H$. Lastly, the x-component vector and y-component vectors are vectored added for each grid point to give the magnetic field at that grid point. Thus a magnetic field distribution is determined for the IC circuit close to the circuit itself. These calculations are made using a computer and the magnetic field may be plotted graphically on a display. In an alternative embodiment the probe 1050 is first moved along the x-axis and then rotated 90 degrees (probe 1053) to move along the y-axis. In another embodiment probe 1050 is first moved along the x-axis 1052 and then rotated 90 degrees and again moved along the same path on the x-axis 1052. In still another embodiment there may be a plurality of probes, for example probe 1050 may move along the x-axis 1052 concurrently with probe 1053 moving along the y-axis 1054.

Figure 13:
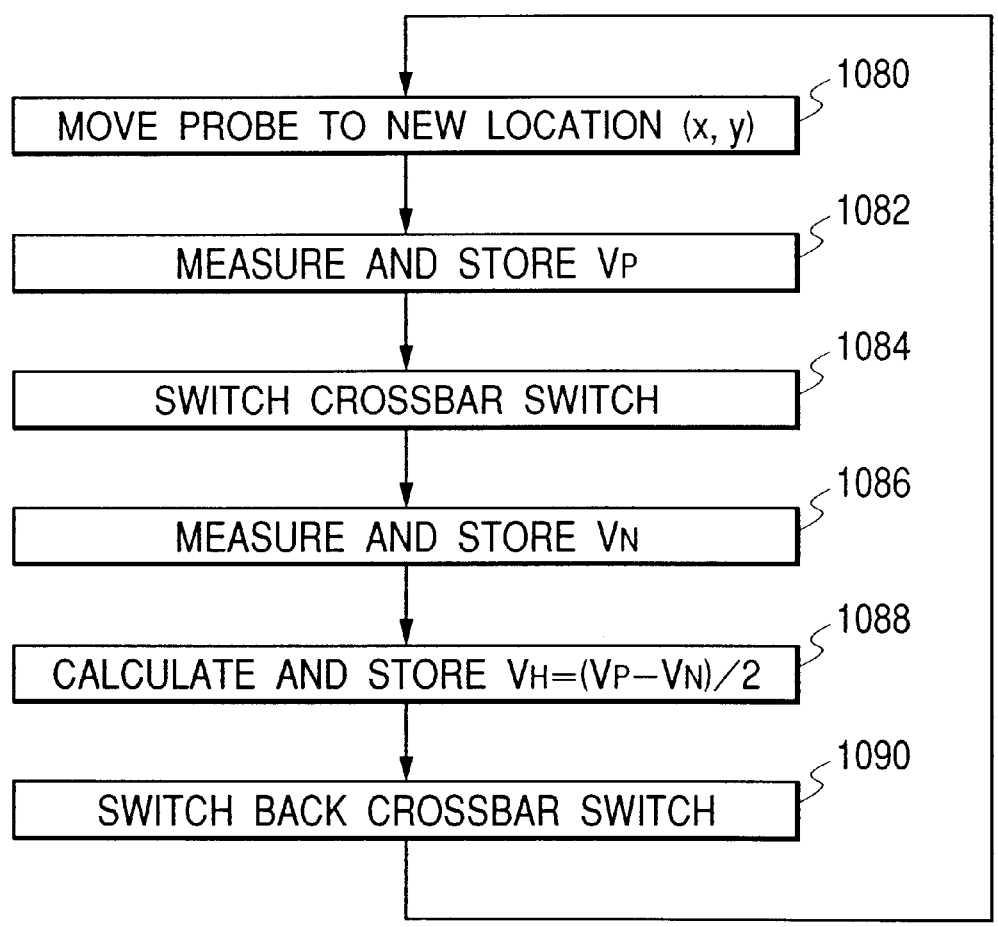
FIG. 13 gives a simplified flowchart for the determination of the magnetic field at a grid point above the IC of an embodiment of the present invention.

FIG. 13 gives a simplified flowchart for the determination of the magnetic field at a grid point above the IC of an embodiment of the present invention. These steps or functions may be performed using software on a computer having a processor and a memory. At step 1080 the magnetic field probe 1050 is moved to a (x, y) position according to the pattern given by FIG. 12 above. $V_P$ is measured using voltmeter 1034 and the result stored in the computer memory (step 1082). The crossbar switch 1030 is then toggled or switched (step 1084) under control of the computer and $V_N$ is next measured using voltmeter 1034 and the result stored in the computer memory (step 1086). The computer then uses equation 4 to calculate $V_H$ and this value is stored as the voltage induced by the magnetic field for probe position (x, y) (step 1088) for either the x direction or y direction depending upon the path the probe 1050 is on as given in FIG. 12. The next step 1090 is optional and switches back or toggles the crossbar switch 1030 to the original position. The computer then moves the probe to the next grid position according to the procedure described for FIG. 12 above and the process is repeated (step 1080). In an alternative embodiment step 1090 is omitted and steps 1082 and 1086 are exchanged for every other iteration of steps 1080 to 1088. This is because, for example, on the next iteration, $V_N$ is measured first, then $V_P$ is measured. Then on the iteration after the next iteration $V_P$ is measured first, then $V_N$ is measured and so on. After all the x and y components of $V_H$ are calculated, the magnetic field distribution for the gird is determined as described above.

Figure 14:
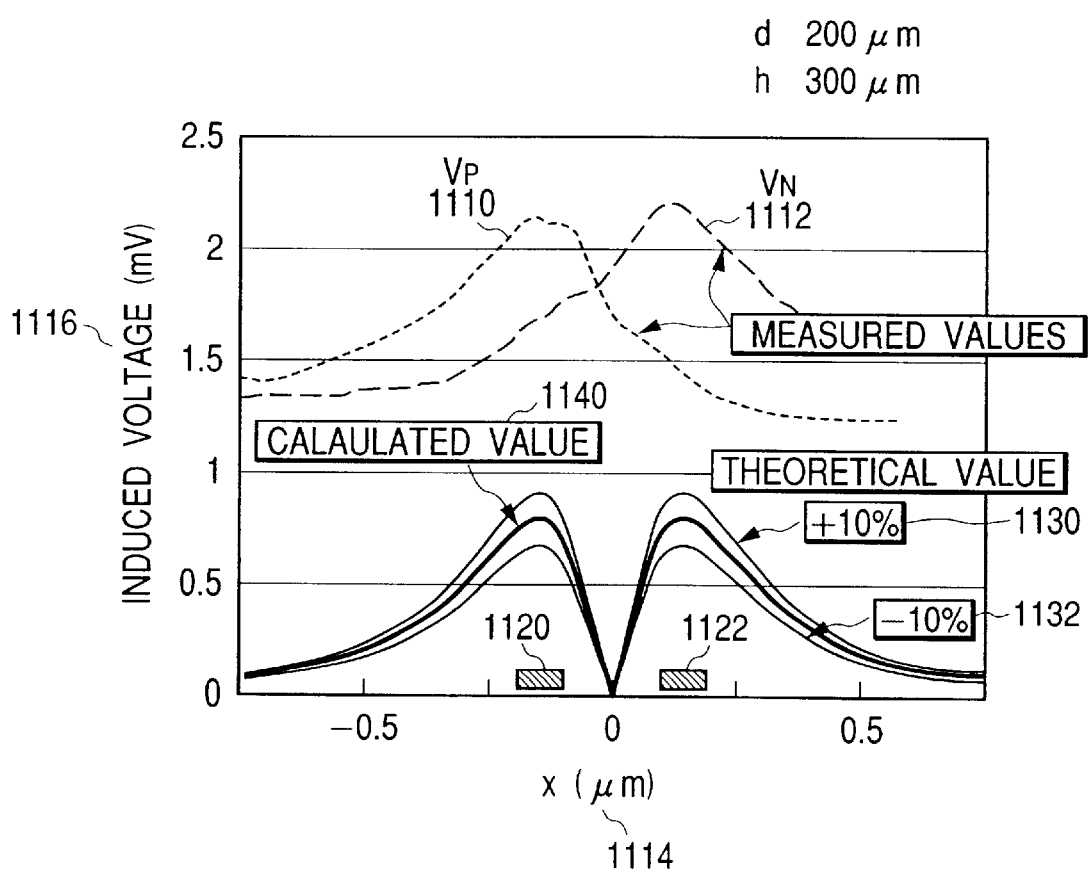
FIG. 14 shows graphs of the induced voltage measured by the magnetic field probe versus horizontal distance x of one embodiment of the present invention.

FIG. 14 shows graphs of the induced voltage 1116 measured by the magnetic field probe (like that shown in FIG. 10) versus horizontal distance x 1114 of one embodiment of the present invention. The graphs shown are for a ten times (10×) enlarged model of that shown in FIG. 2; thus, d=200 μm and h=300 μm (rather than d=20 μm and h=30 μm). The enlarged model was used only for simplifying the test, and the results are substantially the same for the actual size magnetic probe. Graph 1110 shows the measured values for the induced voltage $V_P$, and the graph 1112 shows the measured values for the induced voltage $V_N$. Taking the difference or ($V_P$–$V_N$) gives a resulting graph 1140, which is the calculated value for 2×$V_H$ given by equation 4 above. The two theoretical graphs of the magnetic field are given by graph 1130 which is plus 10 percent of the theoretical value and graph 1132 which is minus 10 percent of the theoretical value. The calculated value (2×$V_H$) 1140 is between the two theoretical graphs 1130 and 1132 and therefore is equal to the theoretical value of the magnetic field alone within the 10 percent margin.

In another embodiment of the present invention a computer program product stored on a computer readable medium for determining a magnetic field distribution of a semiconductor, having an electronic circuit, is provided. The computer program product includes: code for determining a first voltage induced in a measuring circuit by an electromagnetic field of said electronic circuit, wherein said measuring circuit, when used for determining said first voltage, has a first end coupled to ground and a second end coupled to a voltage measuring device; code for determining a second voltage induced in said measuring circuit by said Electro-magnetic field of said electronic circuit, wherein said measuring circuit, when used for determining said second voltage, has said first end coupled to said voltage measuring device and said second end coupled to ground; and code for calculating a magnetic field induced voltage using a difference between said first induced voltage and said second induced voltage, wherein a magnetic field at said measuring circuit is proportional to said magnetic field induced voltage.

Yet another embodiment provides a computer program product stored on a computer readable medium for determining a magnetic field at a location near an integrated circuit. The computer program product includes: code for taking a first measurement at said location of a first induced voltage due to a magnetic field and an electric field; code for taking a second measurement at said location of a second induced voltage due to said magnetic field and said electric field, wherein said second measurement is taken such that a first portion of said second induced voltage due to said magnetic field is a same magnitude, but opposite sign of a second portion of said first induced voltage due to said magnetic field and a third portion of said second induced voltage due to said electric field is equal to a forth portion of said first induced voltage due to said electric field; and code for subtracting said second measurement from said first measurement to get a result proportional to said magnetic field at said location.

Although the above functionality has generally been described in terms of specific hardware and software, it would be recognized that the invention has a much broader range of applicability. For example, the software functionality can be further combined or even separated. Similarly, the hardware functionality can be further combined, or even separated. The software functionality can be implemented in terms of hardware or a combination of hardware and software. Similarly, the hardware functionality can be implemented in software or a combination of hardware and software. Any number of different combinations can occur depending upon the application.

Many modifications and variations of the present invention are possible in light of the above teachings. Therefore, it is to be understood that within the scope of the appended claims, the invention may be practiced otherwise than as specifically described.

What is claimed is:

1. A magnetic field probe system for determining a magnetic field distribution of an integrated circuit inside an integrated circuit package, comprising:
    a measuring probe for measuring an induced voltage produced by an electromagnetic field of said integrated circuit at a height above said integrated circuit on a same order of magnitude as a distance between said integrated circuit's current carrying lines, said measuring probe comprising a first termination point coupled with a second termination point by an electronic circuit;
    a voltage measuring device for measuring said induced voltage; and
    a switch in which a first end is coupled to said measuring probe via said first and second termination points and a second end is coupled to said voltage measuring device and to ground, wherein when said switch is in a first position, said first termination point is coupled to said voltage measuring device and said second termination point is coupled to ground, and when said switch is in a second position, said first termination point is coupled to ground and said second termination point is coupled to said voltage measuring device.

2. The magnetic field probe of claim 1 wherein said switch is a crossbar switch.

3. The magnetic field probe of claim 1 wherein said measuring probe has a dimension equal to about said height.

4. The magnetic field probe of claim 1 wherein said measuring probe is a square probe of dimension 30 $\mu$m by 30 $\mu$m.

5. The magnetic field probe of claim 1 wherein said height is on the same order of magnitude as said distance.

6. The magnetic field probe of claim 1 wherein said measuring probe is a loop of wire.

7. The magnetic field probe of claim 1 wherein said measuring probe is a coil of wire oriented parallel to an integrated circuit's current carrying line.

8. The magnetic field probe of claim 1 further comprising:
    a positioning grid for determining at least one path for said measuring probe to follow, wherein said measuring probe takes at least two measurements at each point in said positioning grid without rotating.

9. A method for determining a magnetic field value of an integrated circuit inside an integrated circuit package, said integrated circuit having a plurality of current carrying lines, said method comprising:
    measuring a first induced voltage due to a current carrying line's electromagnetic field, wherein said first induced voltage includes a first electric field induced voltage;
    measuring a second induced voltage due to said current carrying line's electromagnetic field, such that said second induced voltage includes a second electric field voltage that is substantially equal to said first electric field induced voltage; and
    determining said component of said magnetic field based on a difference between said first induced voltage and said second induced voltage;
    wherein said measuring is performed at a height above said plurality of current carrying lines, and wherein said height is on a same order of magnitude as a distance between said plurality of current carrying lines.

10. The method of claim 9 wherein said first induced voltage is $V_P$ and said second induced voltage is $V_N$ and wherein said determining said component includes calculating $(V_P-V_N)/2$.

11. The method of claim 9 wherein said plurality of current carrying lines, includes a power line.

12. The method of claim 9 wherein said plurality of current carrying lines, includes a signal line.

13. The method of claim 9 wherein said first induced voltage is a first root mean squared (rms) voltage and said second induced voltage is a second root mean squared voltage.

14. The method of claim 9 wherein said integrated circuit has transistor densities equal to or greater than a Large Scale Integrated (LSI) circuit.

15. A method for determining a magnetic field distribution of an electronic circuit of a Large Scale Integrated (LSI) circuit inside said LSI circuit package, comprising:
    determining a first voltage induced in a measuring circuit by an Electro-magnetic field of said electronic circuit, wherein said measuring circuit, when used for determining said first voltage, has a first end coupled to ground and a second end coupled to a voltage measuring device;

determining a second voltage induced in said measuring circuit by said Electro-magnetic field of said electronic circuit, wherein said measuring circuit, when used for determining said second voltage, has said first end coupled to said voltage measuring device and said second end coupled to ground; and calculating a magnetic field induced voltage using a difference between said first induced voltage and said second induced voltage, wherein a magnetic field at said measuring circuit is proportional to said magnetic field induced voltage;

wherein induced voltage measurements from said measuring circuit are taken on the order of 30 micrometers above said electronic circuit.

16. The method of claim 15 wherein said measuring circuit is not rotated between said determining a first voltage and said determining a second voltage.

17. The method of claim 15 wherein said electronic circuit comprises a signal line.

18. The method of claim 15 wherein said electronic circuit comprises a power line.

19. A computer program product stored on a computer readable medium for determining a magnetic field value of an integrated circuit inside an integrated circuit package, said integrated circuit comprising a line, said computer program product comprising:

code for determining a first voltage induced in a measuring circuit by an Electro-magnetic field of said line, wherein said measuring circuit, when used for determining said first voltage, has a first end coupled to ground and a second end coupled to a voltage measuring device;

code for determining a second voltage induced in said measuring circuit by said Electro-magnetic field of said line, wherein said measuring circuit, when used for determining said second voltage, uses a switch to couple said first end to said voltage measuring device and said second end to ground; and code for calculating a magnetic field induced voltage using a difference between said first induced voltage and said second induced voltage, wherein a magnetic field at said measuring circuit is proportional to said magnetic field induced voltage;

wherein induced voltage measurements from said measuring circuit are taken on the order of 30 micrometers above said electronic circuit.

* * * * *